United States Patent
Breitwisch et al.

(10) Patent No.: US 8,536,675 B2
(45) Date of Patent: Sep. 17, 2013

(54) THERMALLY INSULATED PHASE CHANGE MATERIAL MEMORY CELLS

(75) Inventors: Matthew J. Breitwisch, Essex Junction, VT (US); Roger W. Cheek, Somers, NY (US); Eric A. Joseph, White Plains, NY (US); Chung H. Lam, Peekskill, NY (US); Bipin Rajendran, White Plains, NY (US); Alejandro G. Schrott, New York, NY (US); Yu Zhu, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/364,153

(22) Filed: Feb. 1, 2012

(65) Prior Publication Data
US 2012/0126194 A1    May 24, 2012

Related U.S. Application Data

(62) Division of application No. 12/497,596, filed on Jul. 3, 2009, now Pat. No. 8,138,056.

(51) Int. Cl.
*H01L 23/52* (2006.01)
*H01L 29/00* (2006.01)

(52) U.S. Cl.
USPC ............ 257/529; 257/537; 365/45; 365/100; 365/148

(58) Field of Classification Search
USPC ................ 257/529, 536, 537; 365/45, 100, 365/148
See application file for complete search history.

(56) References Cited

U.S. PATENT DOCUMENTS

| | | | |
|---|---|---|---|
| 6,507,061 B1 | 1/2003 | Hudgens et al. | 257/295 |
| 6,908,812 B2 | 6/2005 | Lowrey | 438/253 |
| 8,129,268 B2 * | 3/2012 | Breitwisch | 438/626 |
| 2007/0097739 A1 | 5/2007 | Happ et al. | 365/163 |
| 2008/0197333 A1 * | 8/2008 | Lung | 257/2 |
| 2009/0186444 A1 | 7/2009 | Cho et al. | 438/104 |
| 2009/0189138 A1 * | 7/2009 | Lung et al. | 257/3 |
| 2009/0206318 A1 | 8/2009 | Ko et al. | 257/4 |
| 2009/0251944 A1 * | 10/2009 | Happ et al. | 365/148 |
| 2009/0261408 A1 * | 10/2009 | Fujimoto | 257/330 |
| 2009/0268507 A1 * | 10/2009 | Breitwisch et al. | 365/148 |
| 2010/0019215 A1 * | 1/2010 | Lung et al. | 257/2 |
| 2010/0029062 A1 * | 2/2010 | Lung | 438/466 |
| 2010/0034016 A1 * | 2/2010 | Liu | 365/163 |
| 2010/0144090 A1 * | 6/2010 | Song et al. | 438/104 |
| 2010/0163825 A1 * | 7/2010 | Dennison et al. | 257/3 |
| 2010/0197076 A1 | 8/2010 | Ha et al. | 438/102 |
| 2010/0240189 A1 * | 9/2010 | Jeong et al. | 438/385 |
| 2010/0323491 A1 * | 12/2010 | Moniwa et al. | 438/381 |
| 2011/0076827 A1 | 3/2011 | Liu et al. | 438/382 |
| 2011/0128776 A1 | 6/2011 | Katoh et al. | 365/148 |
| 2011/0133150 A1 * | 6/2011 | Lung et al. | 257/3 |
| 2011/0155986 A1 * | 6/2011 | Kim et al. | 257/2 |
| 2011/0215288 A1 * | 9/2011 | Matsui et al. | 257/2 |
| 2012/0077309 A1 * | 3/2012 | Chen | 438/102 |

* cited by examiner

*Primary Examiner* — Ngan Ngo
(74) *Attorney, Agent, or Firm* — Ido Tuchman; Vazken Alexanian

(57) ABSTRACT

A memory cell structure and method for forming the same. The method includes forming a pore within a dielectric layer. The pore is formed over the center of an electrically conducting bottom electrode. The method includes depositing a thermally insulating layer along at least one sidewall of the pore. The thermally insulating layer isolates heat from phase change current to the volume of the pore. In one embodiment phase change material is deposited within the pore and the volume of the thermally insulating layer. In another embodiment a pore electrode is formed within the pore and the volume of the thermally insulating layer, with the phase change material being deposited above the pore electrode. The method also includes forming an electrically conducting top electrode above the phase change material.

2 Claims, 5 Drawing Sheets

THERMALLY INSULATED PHASE CHANGE MATERIAL MEMORY CELLS

CROSS-REFERENCE TO RELATED APPLICATIONS

This application is a divisional of and claims priority under 35 U.S.C. §120 to U.S. patent application Ser. No. 12/497,596 filed on Jul. 3, 2009, the entire text of which is specifically incorporated by reference herein.

BACKGROUND OF THE INVENTION

1. Field of the Invention

The present invention relates to forming memory cell structures for phase change memory.

2. Description of Background

There are two major groups in computer memory: non-volatile memory and volatile memory. Constant input of energy in order to retain information is not necessary in non-volatile memory but is required in the volatile memory. Examples of non-volatile memory devices are Read Only Memory (ROM), Flash Electrical Erasable Read Only Memory, Ferroelectric Random Access Memory, Magnetic Random Access Memory (MRAM), and Phase Change Memory (PCM). In general, non-volatile memory devices are memory devices in which the state of the memory elements can be retained for days to decades without power consumption. On the other hand, volatile memory devices require constant or very frequent energizing to maintain the state of the memory element. Examples of volatile memory devices include Dynamic Random Access Memory (DRAM) and Static Random Access Memory (SRAM).

The present invention is directed to phase change memory. In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

Chalcogenides are a group of materials commonly utilized as phase change material. This group of materials contain a chalcogen (Periodic Table Group 16/VIA) and another element. Selenium (Se) and tellurium (Te) are the two most common elements in the group used to produce a chalcogenide semiconductor when creating a phase change memory cell. An example of this would be Ge2Sb2Te5 (GST), SbTe, and In2Se3.

Altering the phase change material's state requires heating the material to a melting point and then cooling the material to one of the possible states. A current passed through the phase change material creates ohmic heating and causes the phase change material to melt. Melting and gradually cooling down the phase change material allows time for the phase change material to form the crystalline state. Melting and abruptly cooling the phase change material quenches the phase change material into the amorphous state.

SUMMARY OF THE INVENTION

One aspect of the invention is a method for forming a memory cell structure. The method comprising includes forming a bottom electrode within a substrate, with the bottom electrode being electrically conductive. The method also includes depositing at least one dielectric layer over the bottom electrode. The method is also comprised of forming a pore within the dielectric layer and substantially over the center of the bottom electrode. The pore includes at least one sidewall. The method includes depositing a film of thermally insulating material along the bottom of the pore and along at least one sidewall of the pore. The method also includes depositing a phase change material over the bottom electrode. Additionally, the method includes forming a top electrode over the phase change material.

Another aspect of the invention is another method for forming a memory cell structure. The method includes forming a bottom electrode within a substrate, with the bottom electrode being electrically conductive. The method also includes forming a pillar substantially over the center of the bottom electrode. The pillar includes a phase change material above the bottom electrode and a top electrode above the phase change material. The method is also comprised of depositing a film of thermally insulating material along at least one sidewall of the pillar and over a portion of a top surface of the top electrode.

Yet another aspect of the invention is a memory cell structure. The memory cell structure is comprised of a bottom electrode, with the bottom electrode being comprised of electrically conducting material. The memory cell structure also includes phase change material disposed above the bottom electrode. The memory cell structure is also comprised of a layer of thermally insulating material disposed, at least partially, between the bottom electrode and the phase change material. Additionally, the memory cell structure is comprised of a top electrode, with the top electrode being comprised of electrically conducting material.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings.

DETAILED DESCRIPTION OF THE INVENTION

The present invention is described with reference to embodiments of the invention. Throughout the description of the invention reference is made to FIGS. 1-9.

In typical phase change memory configuration, the phase change material is used to store data bits. An example of such a phase change material is Germanium-Antimony-Tellurium (GST). The phase change material may be programmed to one of at least two states: a crystalline state or an amorphous state (or somewhere in between). The crystalline state may represent a stored "0" value and the amorphous state may represent a stored "1" value. In the crystalline state, the phase change material exhibits a relatively low resistance. On the other hand, in the amorphous state, the phase change material has a relatively high resistance.

In the phase change memory configuration, altering the phase change material's state requires heating the material to a melting point and then cooling the material to one of the possible states. A current passed through the phase change material creates ohmic heating and causes the phase change material to melt. Melting and gradually cooling down the phase change material allows time for the phase change material to form the crystalline state. Melting and abruptly cooling the phase change material quenches the phase change material into the amorphous state.

As described below, an aspect of the present invention is a method for forming a memory cell structure for phase change memory. The method includes forming a bottom electrode within a substrate. The method also includes depositing a dielectric layer above the bottom electrode and forming a pore within a dielectric layer substantially above the bottom electrode. The method includes depositing a thermally insulating material along the bottom of the pore and along at least one sidewall of the pore. The method also includes forming phase change material above the bottom electrode.

The thermally insulating material isolates the heat generated by ohmic heating to the volume contained within the pore. The thermally insulating material reduces heat dissipating to the surrounding dielectric material, thus, reducing the energy required to melt the phase change material.

Figure 1:
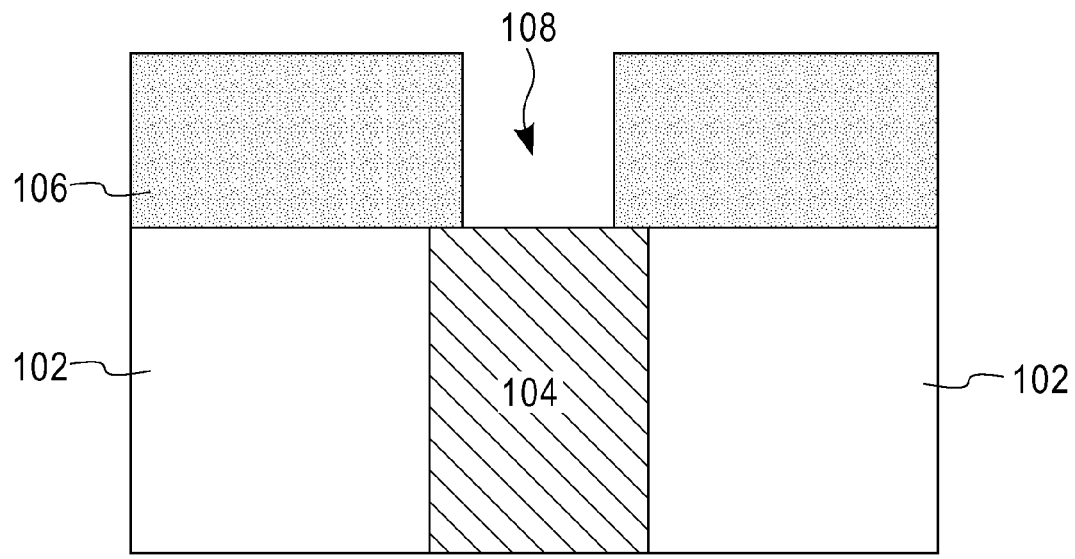
FIG. 1 illustrates a substrate, a bottom electrode, and a dielectric layer with a pore.

FIG. 1 illustrates the substrate 102, the bottom electrode 104 comprised of electrode material, the dielectric layer 106 comprised of dielectric material, and the pore 108. The bottom electrode 104 is formed within the substrate 102. Those skilled in the art will recognize that a variety of processes may be utilized to form the bottom electrode 104 within the substrate 102, such as shallow trench isolation (STI) and metal sputter deposition. The bottom electrode is comprised of electrode material that is electrically conducting, such as but not limited to Tungsten (W) or Titanium Nitride (TiN). The dielectric layer 106 is then deposited above the substrate 102 and bottom electrode 104. A variety of processes may be utilized to deposit the dielectric layer 106, such as, chemical vapor deposition (CVD) or plasma enhanced chemical vapor deposition (PECVD). In one particular embodiment of the invention the dielectric layer 106 is comprised of Silicon Dioxide ($SiO_2$).

The pore 108 is formed within the dielectric layer 106 and substantially over the center of the bottom electrode 104, as shown. A process such as shallow trench isolation may be utilized in forming the pore 108 within the dielectric layer 106.

Figure 2:
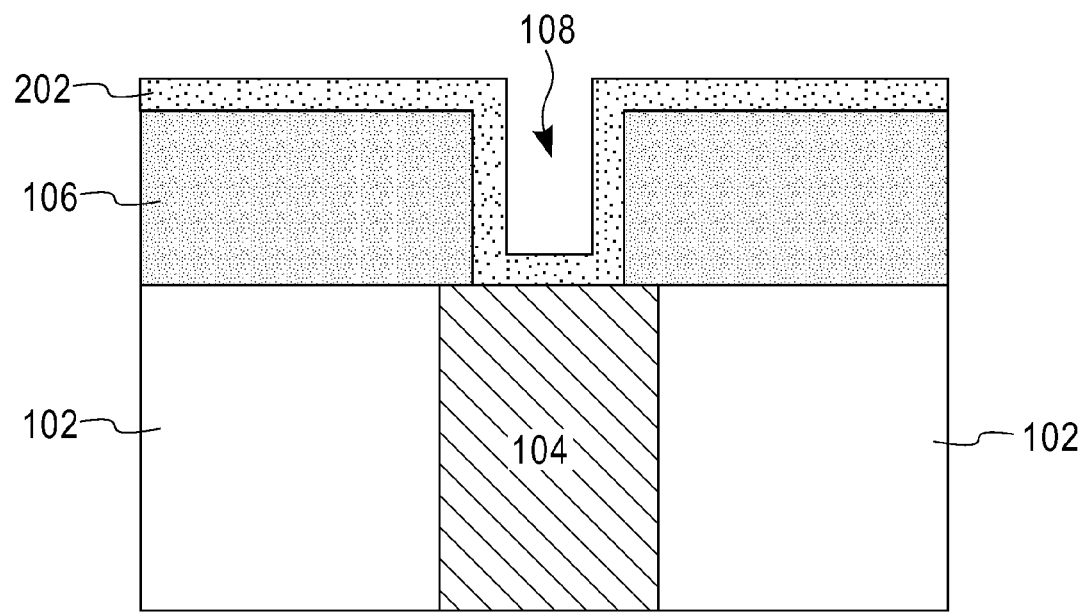
FIG. 2 illustrates thermally insulating layer deposition.

Now turning to FIG. 2, the thermally insulating material 202 is deposited along the bottom of the pore 108 and along at least one sidewall of the pore 108. Again, those skilled in the art will recognize that a variety of processes may be utilized in depositing the thermally insulating material 202, such as chemical vapor deposition. In one embodiment of the invention, the thermally insulating material 202 is Tantalum Oxide ($Ta_2O_5$). The thermally insulating material 202 helps isolate the heat generated by ohmic heating to the volume contained within the pore 108.

Figure 3:
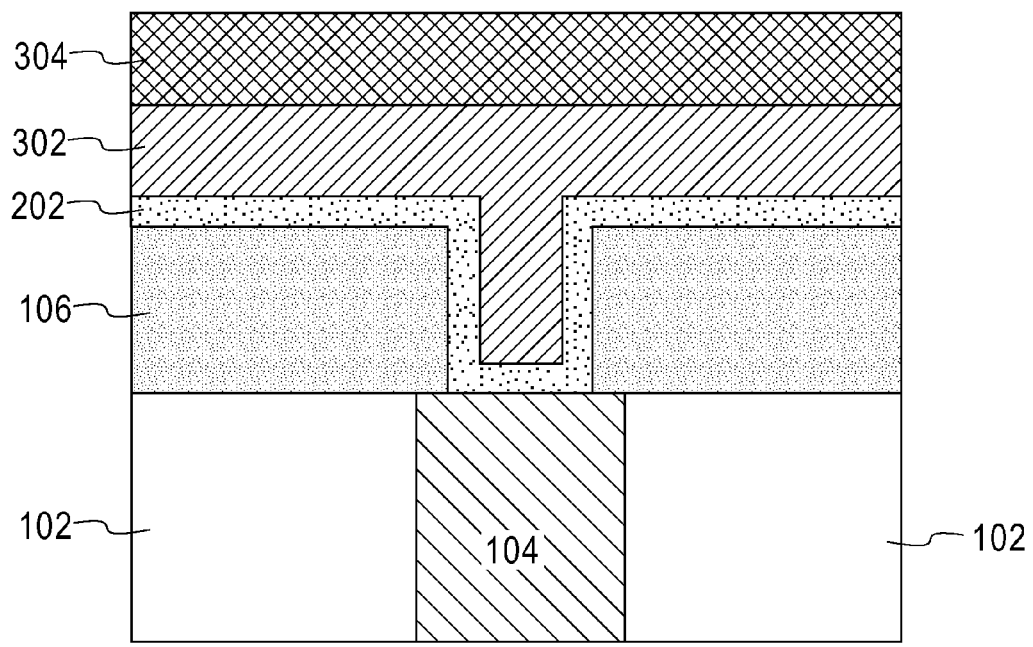
FIG. 3 illustrates phase change memory deposition and top electrode formation.

Shown in FIG. 3 is the deposition of the phase change material 302 over the bottom electrode 104 and into the pore and within the volume of the thermally insulating layer 202. Those skilled in the art will recognize that a variety processes may be utilized for phase change material 302 deposition, such as chemical vapor deposition. In one particular embodiment of the invention the phase change material 302 is Germanium-Antimony-Tellurium (GST). A top electrode 304 is then formed above the phase change material 302. Again, a variety of processes may be utilized for forming the top electrode 304, such as metal sputter deposition. In one particular embodiment of the invention, the top electrode 304 is comprised of Titanium Nitride. In one embodiment, the film of thermally insulating material allows electrons to tunnel from the bottom electrode to the phase change material during operation of the memory cell.

Figure 4:
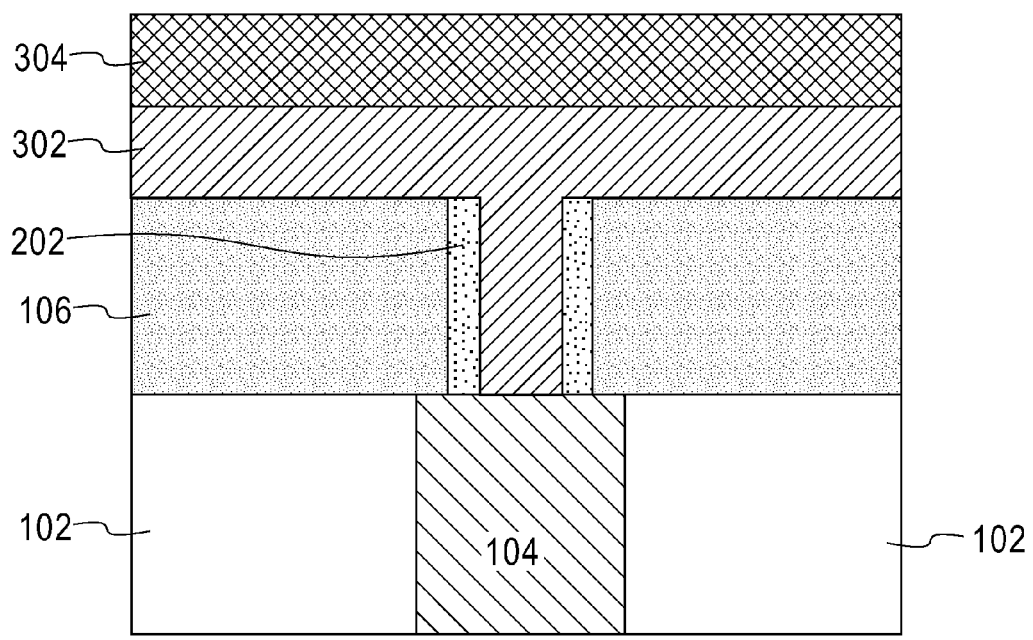
FIG. 4 illustrates an alternate embodiment of the invention.

FIG. 4 illustrates an alternate embodiment of the invention. In this particular embodiment, the thermally insulating material 202 is removed from the bottom of the pore and the top surface of the dielectric layer 106. The removal occurs prior to the deposition of the phase change material 302. Those skilled in the art will recognize that a variety of processes may be utilized to remove the thermally insulating material 202 from the bottom of the pore, such as a directional reactive-ion etch (RIE).

Figure 5:
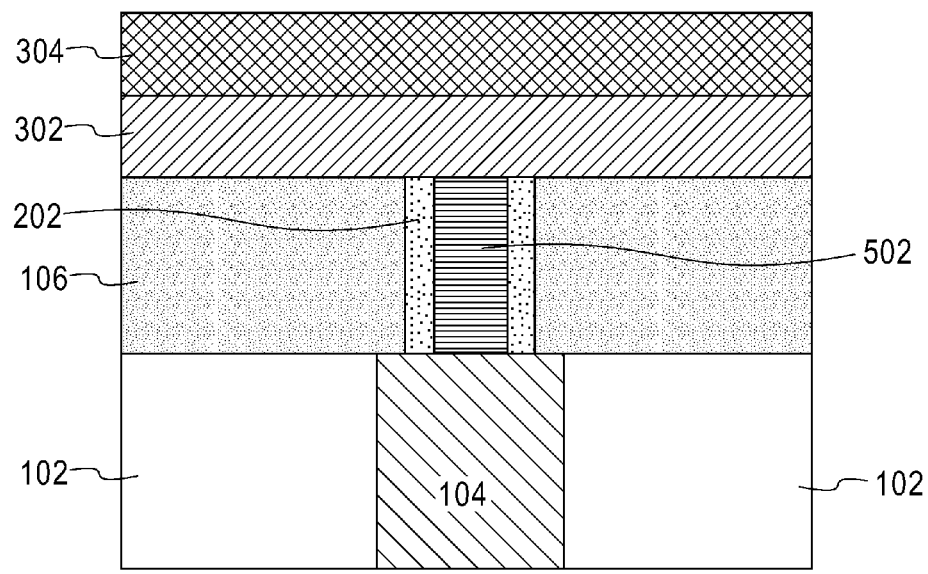
FIG. 5 illustrates an alternate embodiment of the invention with a pore electrode.

FIG. 5 illustrates another embodiment of the invention. In this particular embodiment, a pore electrode 502 is formed in the pore. The pore electrode 502 is comprised of an electrically conducting material. A variety of processes may be utilized in forming the pore electrode 502, such as metal sputter deposition. In one particular embodiment, the pore electrode 502 is comprised of Titanium Nitride. Once the pore electrode 502 is created, the phase change material 302 and the top electrode 304 are deposited over the pore electrode 502, as described above.

Figure 6:
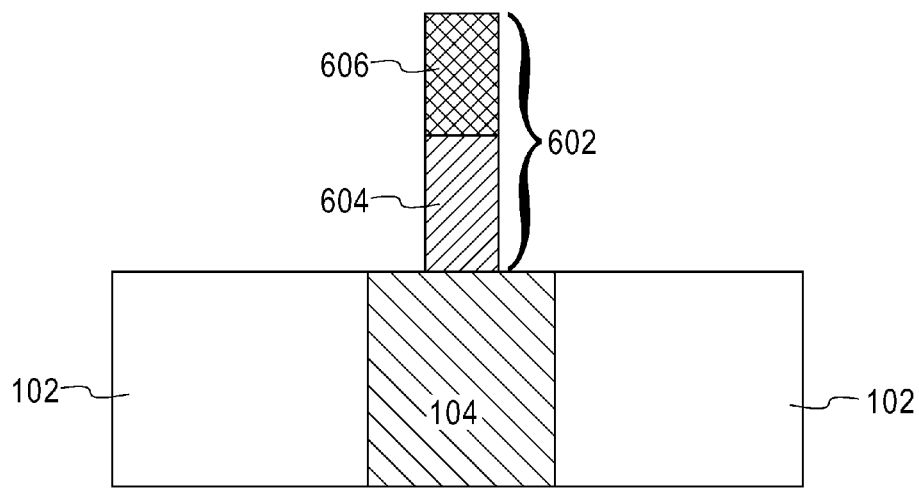
FIG. 6 illustrates a substrate, a bottom electrode, and a pillar.

Now turning to FIG. 6, yet another embodiment of the invention is shown. In this particular embodiment, the bottom electrode 104 is formed within the substrate 102 and a pillar 602 is formed substantially over the center of the bottom electrode 104. The pillar 602 includes phase change material 704 above the bottom electrode 104 and a top electrode 606 above the phase change material 604. The top electrode 606 is comprised of electrically conducting material. In one embodiment of the invention, the top electrode 606 is comprised of Titanium Nitride.

A variety of processes may be utilized in forming the pillar 602. An example of such processes begins with depositing the phase change material 604 and the electrode material above the bottom electrode 104. A photolithographic mask is then used to protect the areas above the center of the bottom electrode 104. A directional reactive-ion etch is used to remove the unprotected areas. Finally, a photo-resist strip is utilized to remove the photolithographic mask.

In an alternate embodiment of the invention, forming the pillar also includes depositing a first layer between the phase change material 604 and the bottom electrode 104. In this particular embodiment of the invention, the first layer is oxidized such that a portion of the first layer is thermally insulating and a portion of the first layer is electrically conducting. In one particular embodiment of the invention, the first layer is comprised of Tantalum (Ta).

In another embodiment of the invention, forming the pillar also includes depositing the first layer between the phase change material 604 and the bottom electrode 104, and depositing a second layer between the top electrode 606 and the phase change material 604. In this particular embodiment of the invention, the first layer and second layer are oxidized such that a portion of the first layer and a portion of the second layer are thermally insulating and a portion of the first layer and a portion of the second layer are electrically insulating. In one particular embodiment of the invention, the first layer and the second layer are comprised of Tantalum.

Figure 7:
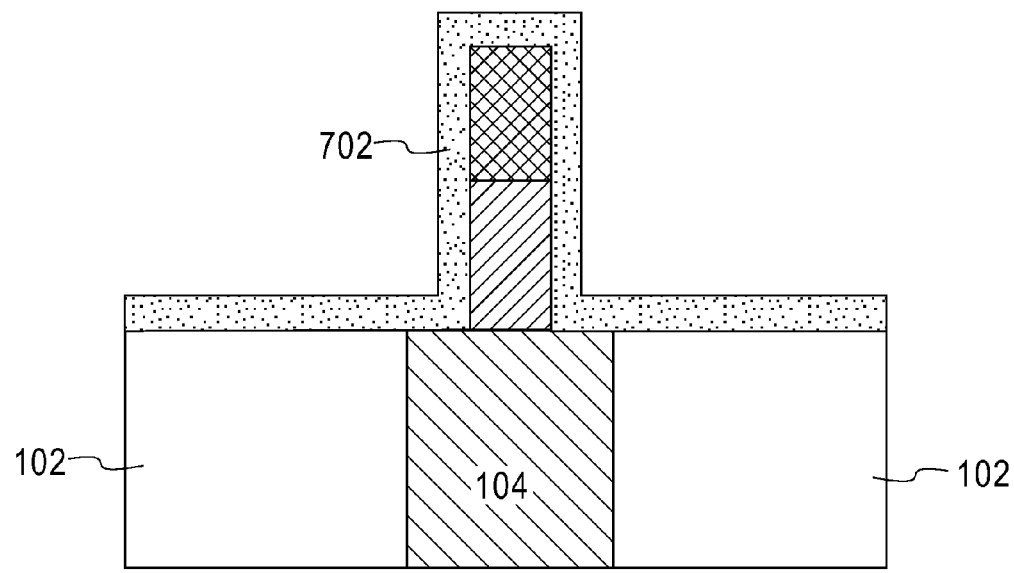
FIG. 7 illustrates thermally insulating layer deposition deposition.

Now turning to FIG. 7, a film of thermally insulating material 702 is deposited along at least one sidewall of the pillar and over a portion of a top surface of the top electrode. In one particular embodiment of the invention, the film of thermally insulating material 702 is comprised of Tantalum Oxide. As stated above, the film of thermally insulating material 702 helps isolate the heat created by ohmic heating to the materials comprising the pillar.

Figure 8:
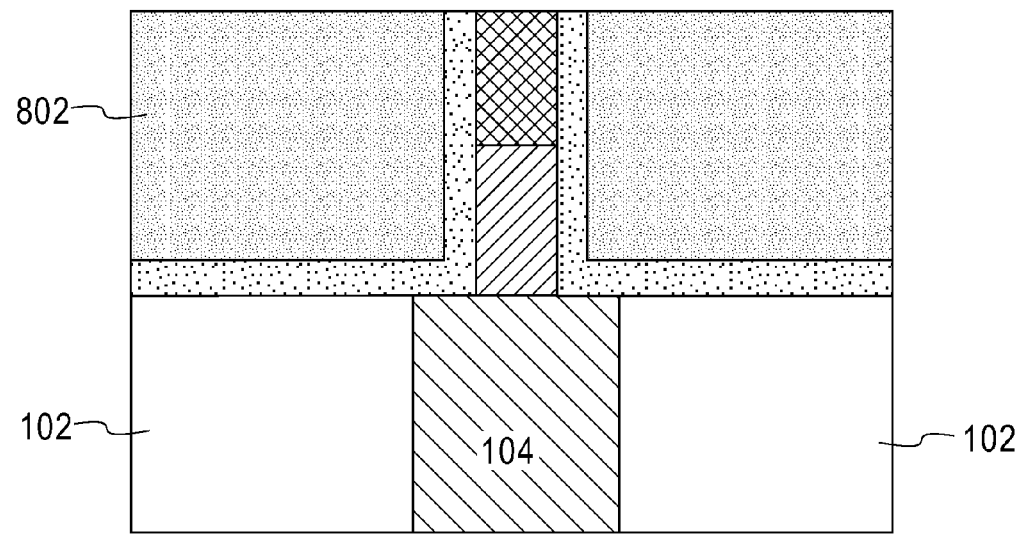
FIG. 8 illustrates dielectric layer deposition.

In FIG. 8, a dielectric layer 802 is deposited above the film of thermally insulating material. In one embodiment of the invention, the dielectric layer 802 is comprised of Silicon Dioxide. Those skilled in the art will recognize that a variety of processes may be utilized to deposit the dielectric layer 802, such as CVD and PECVD. Additionally, a dry etch, a wet etch, and a chemical mechanical polish (CMP) may be used to finish the surface.

Figure 9:
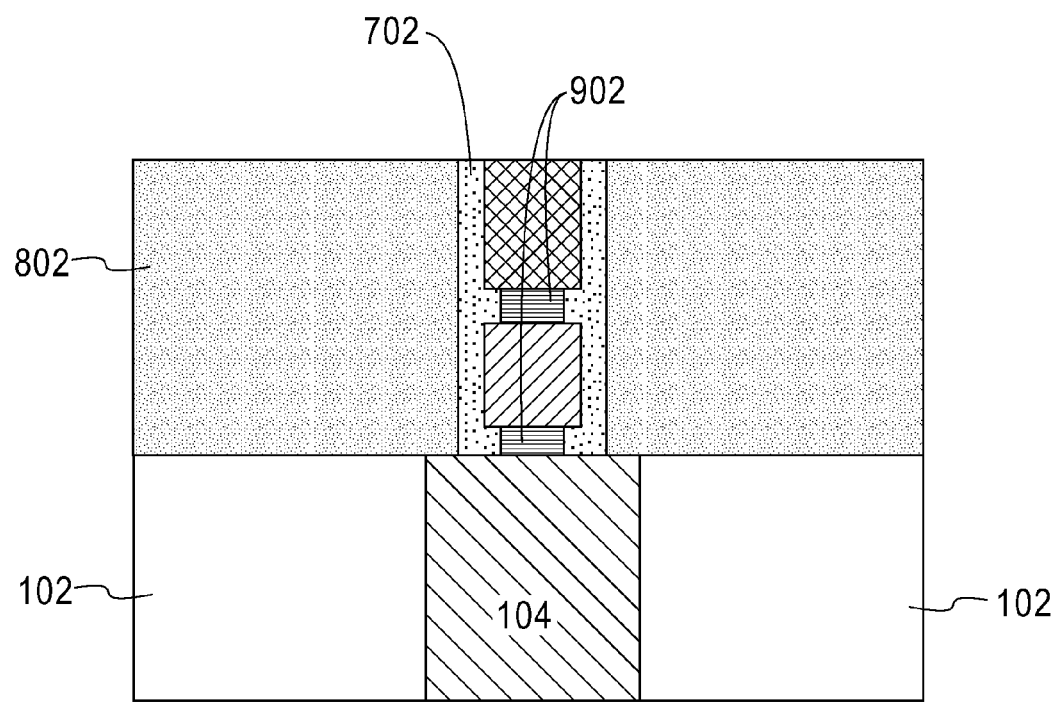
FIG. 9 illustrates an alternate embodiment of the invention.

In FIG. 9, an alternate embodiment of the invention is illustrated. In this particular embodiment, the film of thermally insulating material 702 is deposited along at least one sidewall of the pillar. The pillar, in this particular embodiment, includes the first layer and the second layer (as mentioned above). As illustrated, a portion of the first layer and a portion of the second layer are thermally insulating and match the film of thermally insulating material 702. Additionally, a portion of the first layer and a portion of the second layer are electrically conducting 902. The electrically conducting portions 902 of the first layer and the second layer allow current to flow from the bottom electrode 104, to the phase change material, to the top electrode. The film of thermally insulating material 702 helps isolate the heat to the phase change material and the top electrode.

Having described preferred embodiments for the method for forming a memory cell structure (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A memory cell structure, the memory cell structure comprising:
    a bottom electrode comprised of electrically conducting material;
    phase change material disposed above the bottom electrode;
    a layer of thermally insulating material in physical contact with both the bottom electrode and the phase change material;
    a top electrode comprised of electrically conducting material; and
    a layer of thermally insulating material disposed, at least partially, between the phase change material and the top electrode.

2. The memory cell structure of claim 1, wherein the thermally insulating material is comprised of Tantalum Oxide.

* * * * *